(12) United States Patent
Martin et al.

(10) Patent No.: US 7,151,411 B2
(45) Date of Patent: Dec. 19, 2006

(54) AMPLIFIER SYSTEM AND METHOD

(75) Inventors: James Martin, Londonderry, NH (US); Izzac Khayo, Nashua, NH (US); Rich Keenan, Whitinsville, MA (US); Valter Karavanic, Nashua, NH (US); Greg Mendolia, Hollis, NH (US)

(73) Assignee: Paratek Microwave, Inc., Columbia, MD (US)

( * ) Notice: Subject to any disclaimer, the term of this patent is extended or adjusted under 35 U.S.C. 154(b) by 83 days.

(21) Appl. No.: 10/980,394

(22) Filed: Nov. 3, 2004

(65) Prior Publication Data

US 2005/0206457 A1    Sep. 22, 2005

Related U.S. Application Data

(60) Provisional application No. 60/554,025, filed on Mar. 17, 2004.

(51) Int. Cl.
*H03F 3/04*  (2006.01)
(52) U.S. Cl. .................... 330/305; 330/310
(58) Field of Classification Search .......... 330/305, 330/310
See application file for complete search history.

(56) References Cited

U.S. PATENT DOCUMENTS

| | | | |
|---|---|---|---|
| 5,312,790 A | 5/1994 | Sengupta et al. ........... 501/137 |
| 5,427,988 A | 6/1995 | Sengupta et al. ........... 501/137 |
| 5,486,491 A | 1/1996 | Sengupta et al. ........... 501/137 |
| 5,593,495 A | 1/1997 | Masuda et al. ............... 117/4 |
| 5,600,187 A * | 2/1997 | El-Hamamsy et al. ...... 307/157 |
| 5,635,433 A | 6/1997 | Sengupta ..................... 501/137 |
| 5,635,434 A | 6/1997 | Sengupta ..................... 501/138 |
| 5,640,042 A | 6/1997 | Koscica et al. .............. 257/595 |
| 5,693,429 A | 12/1997 | Sengupta et al. ........... 428/699 |
| 5,694,134 A | 12/1997 | Barnes ......................... 343/700 |
| 5,766,697 A | 6/1998 | Sengupta et al. ........... 427/585 |
| 5,830,591 A | 11/1998 | Sengupta et al. ........... 428/701 |
| 5,846,893 A | 12/1998 | Sengupta et al. ........... 501/137 |
| 5,886,867 A | 3/1999 | Chivukula et al. .......... 361/311 |
| 5,990,766 A | 11/1999 | Zhang et al. ................ 333/205 |
| 6,020,787 A * | 2/2000 | Kim et al. .................... 330/279 |
| 6,074,971 A | 6/2000 | Chiu et al. ................... 501/139 |
| 6,130,589 A * | 10/2000 | Yamaguchi et al. .......... 333/32 |
| 6,160,572 A * | 12/2000 | Matsuura .................... 725/126 |
| 6,377,142 B1 | 4/2002 | Chiu et al. ................... 333/238 |
| 6,377,217 B1 | 4/2002 | Zhu et al. .................... 343/700 |
| 6,377,440 B1 | 4/2002 | Zhu et al. .................... 361/311 |
| 6,404,614 B1 | 6/2002 | Zhu et al. .................... 361/277 |
| 6,492,883 B1 | 12/2002 | Liang et al. ................. 333/132 |
| 6,514,895 B1 * | 2/2003 | Chiu et al. ................... 501/137 |

(Continued)

*Primary Examiner*—Patricia Nguyen
(74) *Attorney, Agent, or Firm*—James S. Finn

(57) ABSTRACT

An embodiment of the present invention provides an amplifier system, comprising at least one variable impedance matching network, the output of which provides the input to at least one amplifier stage or provides an output of the power amplifier itself, and a bias network associated with the at least one amplifier stage. The amplifier system may further comprise a controller enabling impedance control to the at least one variable impedance matching network and a supply voltage provided to the at least one variable impedance network and/or the at least one amplifier stage and wherein the at least one variable impedance network and the at least one amplifier stage may be a plurality of impedance networks connected to a plurality of amplifier stages. The at least one variable impedance network may include at least one variable capacitor and the at least one variable capacitor may be a voltage tunable dielectric capacitor which may include Parascan® voltage tunable dielectric material.

25 Claims, 3 Drawing Sheets

U.S. PATENT DOCUMENTS

| | | | |
|---|---|---|---|
| 6,525,630 B1 | 2/2003 | Zhu et al. | 333/205 |
| 6,531,936 B1 | 3/2003 | Chiu et al. | 333/164 |
| 6,535,076 B1 | 3/2003 | Partridge et al. | 333/17.1 |
| 6,538,603 B1 | 3/2003 | Chen et al. | 342/372 |
| 6,556,102 B1 | 4/2003 | Sengupta et al. | 333/161 |
| 6,590,468 B1 | 7/2003 | du Toit et al. | 333/17.3 |
| 6,597,265 B1 | 7/2003 | Liang et al. | 333/204 |
| 6,657,497 B1 * | 12/2003 | Yang et al. | 330/277 |
| 6,965,837 B1 * | 11/2005 | Vintola | 702/65 |
| 7,048,992 B1 * | 5/2006 | Zhang et al. | 428/209 |

* cited by examiner

AMPLIFIER SYSTEM AND METHOD

CROSS-REFERENCE TO RELATED APPLICATION

This application claims the benefit of priority under 35 U.S.C Section 119 from U.S. Provisional Application Ser. No. 60/554,025, filed Mar. 17, 2004, entitled, "Tunable PA Output Match".

BACKGROUND OF THE INVENTION

Amplifiers, particularly those employed in modern wireless communication networks, may have a variety of possible modes of operation. The optimum mode of operation depends upon the format of data transmission or modulation scheme and the frequency of transmission. Amplifier design variables such as transistor sizes, supply voltages, bias points, and impedances for the source and load are chosen to insure optimized efficiency, linearity, and gain control while meeting the specifications of a given transmission scheme. Different modulation schemes may place dramatically different requirements on the amplifier, leading to significant differences in ideal values for these variables.

In a typical amplifier most, if not all, of these variables are fixed in the design, meaning that the amplifier is suitable for only one mode of transmission. As an example, and not by way of limitation, it is desirable for the manufacturers of wireless handsets to utilize the same power amplifier for transmission of both EDGE (Enhanced Data rates for Global Evolution) and GSM (Global System for Mobile Communications) modulated signals for data and voice, respectively. However, EDGE requires a very linear amplifier for signal integrity, while GSM operates most efficiently in a highly saturated amplifier.

Thus, there is a strong need in the industry for an improved amplifier system and method capable of improved amplifier efficiency, linearity, and gain control for both linear and saturated modes of operation.

SUMMARY OF THE INVENTION

An embodiment of the present invention provides an amplifier system, comprising at least one variable impedance matching network, the output of which provides the input to at least one amplifier stage or provides an output of the power amplifier itself, and a bias network associated with the at least one amplifier stage. The amplifier system may further comprise a controller enabling impedance control to the at least one variable impedance matching network and a supply voltage provided to the at least one variable impedance network and/or the at least one amplifier stage and wherein the at least one variable impedance network and the at least one amplifier stage may be a plurality of impedance networks connected to a plurality of amplifier stages. The at least one variable impedance network may include at least one variable capacitor and the at least one variable capacitor may be a voltage tunable dielectric capacitor which may include Parascan® voltage tunable dielectric material.

The impedance and supply voltage control applied to the at least one amplifier stage within a transmission system may enable a single power amplifier to operate in multiple modes including both saturated and linear modes as applied in GSM, EDGE, WCDMA, and CDMA. Further, the impedance control may include both open and closed loop power control topologies and the at least one variable impedance matching network may be a lumped element inductor/capacitor impedance matching network.

Another embodiment of the present invention may provide a method of varying the impedance in an amplifier system, comprising varying the impedance in a least one variable impedance matching network to provide a variable input or output impedance to at least one amplifier stage by associating a control voltage with the at least one amplifier stage. The method may further comprise providing impedance control to the at least one variable impedance matching network and supplying a voltage to the at least one variable impedance network and/or the at least one amplifier stage. The at least one variable impedance network and the at least one amplifier stage may be a plurality of impedance networks connected to a plurality of amplifier stages and may further comprise including at least one variable capacitor within the at least one variable impedance network. The at least one variable capacitor may be a voltage tunable dielectric capacitor such as a voltage tunable dielectric capacitor including Parascan® voltage tunable dielectric material.

Yet another embodiment of the present invention provides a system capable of impedance matching, comprising an apparatus connected an amplifier via an impedance matching network; and the impedance matching network may includes at least one variable capacitor enabling the ability to vary the impedance of the impedance matching network. The at least one variable capacitor may be a voltage tunable dielectric capacitor which may include Parascan® voltage tunable dielectric material. Further, the apparatus may be selected from the group consisting of: an antenna, filter, subsequent amplifier stage, diplexer, switch, mixer, oscillator, up converter, or multiplier.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DESCRIPTION OF THE PREFERRED EMBODIMENT

Figure 1:
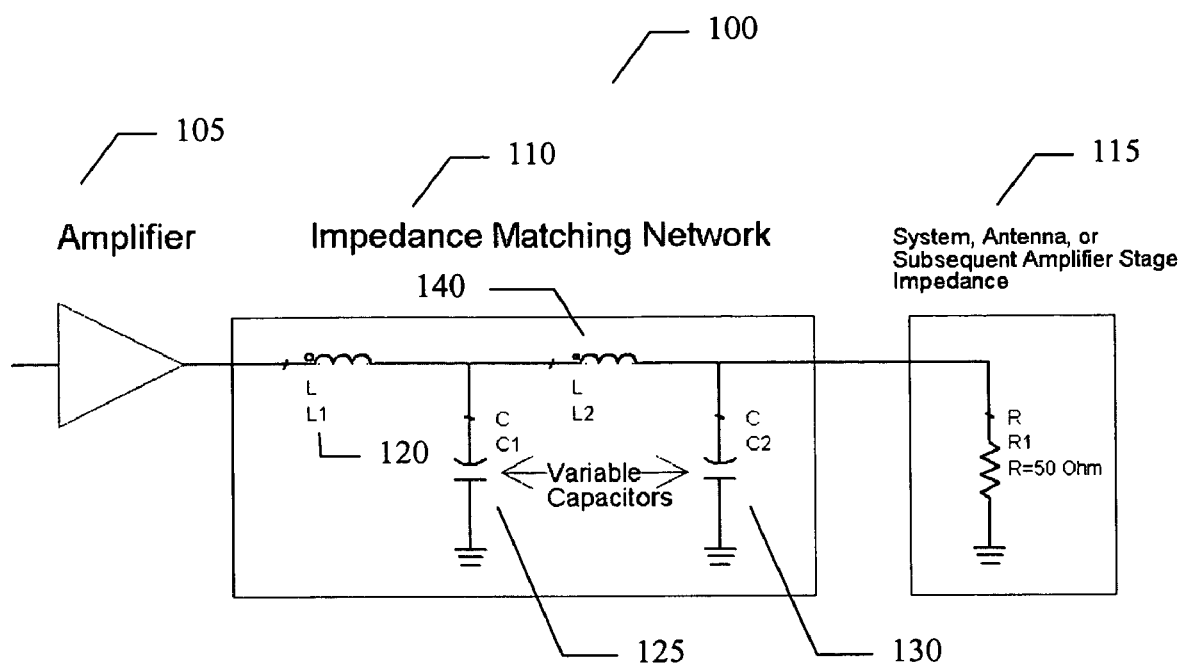
FIG. 1 depicts an example of an amplifier impedance matching circuit including variable capacitors for impedance optimization.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

It should be understood that embodiments of the present invention may be used in a variety of applications. Although the present invention is not limited in this respect, the devices disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's), notebook computers in wireless local area networks (WLAN) or wide are networks (WAN), or personal area networks (PAN, and the like).

An embodiment of the present invention provides an apparatus, system and method by which one, two or more of the amplifier design variables may be switched or varied dynamically to provide improved efficiency, linearity, or gain control for more than one format of data transmission or for different frequencies of operation, although the present invention is not limited in this respect. This power amplifier control may be achieved through simultaneous variation of the source, load, or inter-stage impedances and the supply voltage.

To facilitate the aforementioned, variable impedance networks may be implemented in the present invention. Power amplifiers typically require load impedances well below the standard 50 Ohms used in most RF systems. Output matching networks consisting of lumped capacitors and inductors, transmission lines, or transformers may be used to transform between this low impedance and 50 Ohms. Matching networks are also utilized in multistage amplifiers to transform between the optimum load impedance of a stage earlier in the line to the optimum source impedance of the subsequent stage. There are several advantages offered by tunable matching networks, including optimization of amplifier match at varying frequency and against variable load VSWR. Further, as the output power is reduced in a variable gain amplifier, the load impedance which allows the amplifier to operate with optimum efficiency changes. With a fixed matching network, an amplifier which had been tuned for peak efficiency at the maximum output power level will show severely degraded efficiency as the gain is lowered and the output power drops. With a variable impedance matching network, the impedance may be adjusted to allow optimum efficiency at both low and high power settings.

Currently, existing methodologies addressing this problem include fixed impedance networks and varactor diodes. However, shortcomings of earlier solutions include standard matching networks present fixed impedance transformations at a given frequency. This limits the efficient operating range of an amplifier to a narrow range of frequencies and a small range of power and bias settings.

Parascan® materials have many advantages over varactor diodes and may be utilized in the present invention; although the present invention is not limited to using Parascan® materials. The term Parascan® as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200–6,000) and large change in dielectric constant with applied voltage (25–75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO—MgO"; U.S. Pat. No. 5,486,491 to Sengupta, et al. entitled "Ceramic Ferroelectric Composite Material-BSTO—ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO—MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), PbTiO3, BaCaZrTiO3, NaNO3, KNbO3, LiNbO3, LiTaO3, PbNb2O6, PbTa2O6, KSr(NbO3) and NaBa2(NbO3) 5KH2PO4, and mixtures and compositions thereof. Also, these materials can be combined with low loss dielectric materials, such as magnesium oxide (MgO), aluminum oxide (Al2O3), and zirconium oxide (ZrO2), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patent applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, MgAl2O4, MgTiO3, Mg2SiO4, CaSiO3, MgSrZrTiO6, CaTiO3, Al2O3, SiO2 and/or other metal silicates such as BaSiO3 and SrSiO3. The non-tunable dielectric phases may be any combination of the above, e.g., MgO combined with MgTiO3, MgO combined with MgSrZrTiO6, MgO combined with Mg2SiO4, MgO combined with Mg2SiO4, Mg2SiO4 combined with CaTiO3 and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include CaZrO3, BaZrO3, SrZrO3, BaSnO3, CaSnO3, MgSnO3, Bi2O3/2SnO2, Nd2O3, Pr7O11, Yb2O3, Ho2O3, La2O3, MgNb2O6, SrNb2O6, BaNb2O6, MgTa2O6, BaTa2O6 and Ta2O3.

Thick films of tunable dielectric composites may comprise Ba1-xSrxTiO3, where x is from 0.3 to 0.7 in combination with at least one non-tunable dielectric phase selected from MgO, MgTiO3, MgZrO3, MgSrZrTiO6, Mg2SiO4, CaSiO3, MgAl2O4, CaTiO3, Al2O3, SiO2, BaSiO3 and SrSiO3. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include Mg2SiO4, CaSiO3, BaSiO3 and SrSiO3. In addition to Group 2A metals, the present metal silicates may include metals from Group 1A, i.e., Li, Na, K, Rb, Cs and Fr, preferably Li, Na and K. For example, such metal silicates may include sodium silicates such as Na2SiO3 and NaSiO3-5H2O, and lithium-containing silicates such as LiAlSiO4, Li2SiO3 and Li4SiO4. Metals from Groups 3A, 4A and some transition metals of the Periodic Table may also be suitable constituents of the metal silicate phase. Additional metal silicates may include Al2Si2O7, ZrSiO4, KalSi3O8, NaAlSi3O8, CaAl2Si2O8, CaMgSi2O6, BaTiSi3O9 and Zn2SiO4. The above tunable materials may be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include Mg2SiO4, MgO, CaTiO3, MgZrSrTiO6, MgTiO3, MgAl2O4, WO3, SnTiO4, ZrTiO4, CaSiO3, CaSnO3, CaWO4, CaZrO3, MgTa2O6, MgZrO3, MnO2, PbO, Bi2O3 and La2O3. Particularly preferred additional metal oxides include Mg2SiO4, MgO, CaTiO3, MgZrSrTiO6, MgTiO3, MgAl2O4, MgTa2O6 and MgZrO3.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

The broad tuning range and high linearity of an impedance matching network including Parascan® capacitors offer significantly better performance than a varactor diode based solution. Turning now to FIG. 1, shown generally as 100 is illustrated a schematic example of a lumped element inductor/capacitor impedance matching network 110 associated with amplifier 105 and system, antenna or subsequent amplifier stage impedance 115. The impedance matching network may include inductors 120 and 140. It is understood that this is but one example circuit and the present invention is not limited to this circuit. The shunt capacitors may be replaced in whole or part with Parascan® variable capacitors 125, 130 to achieve the desired impedance shift for amplifier efficiency optimization—although the present invention is not limited to the use of Parascan® variable capacitors.

Figure 2:
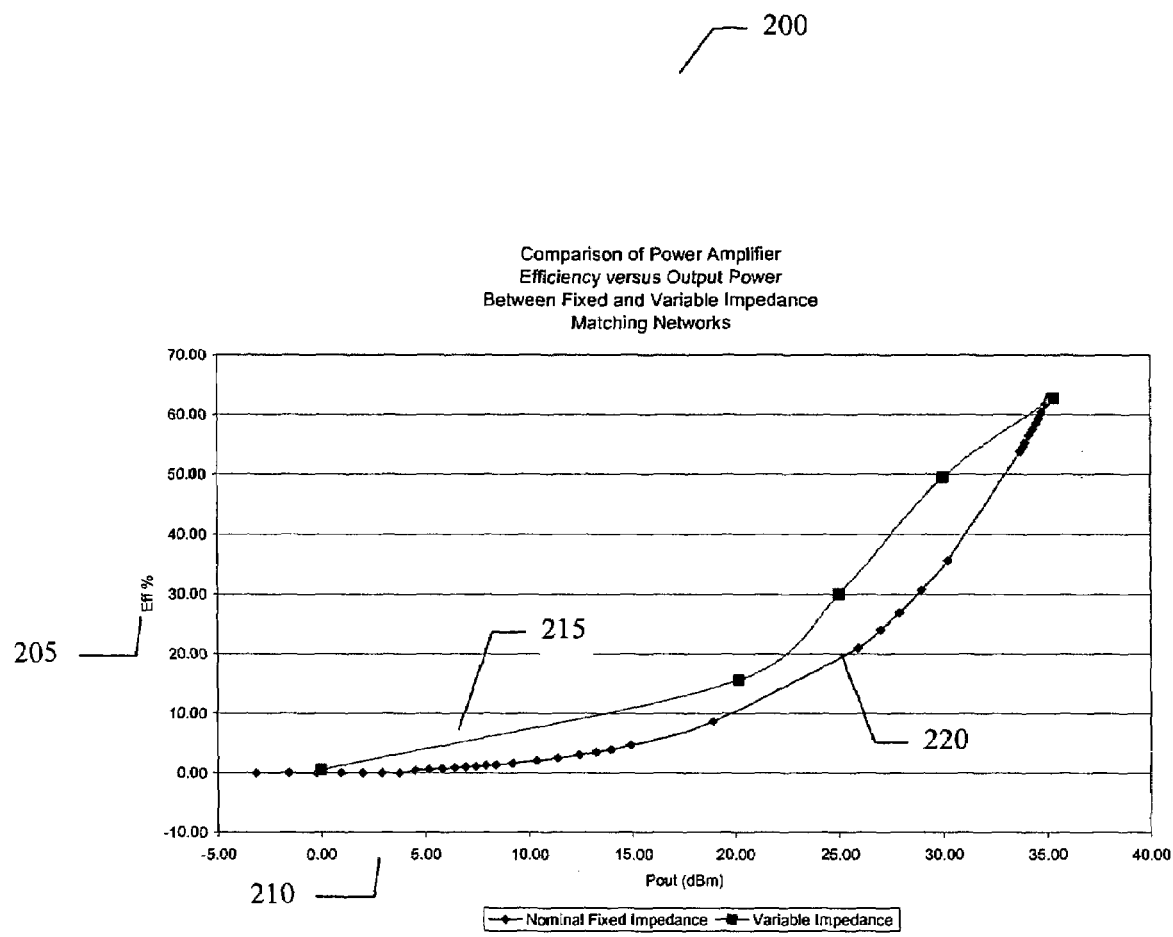
FIG. 2 graphically illustrates amplifier efficiency as a function of amplifier output power with a variable impedance matching network allowing the amplifier to operate more efficiently at output powers below the maximum.

FIG. 2, generally at 200, illustrates simulations of one example of the present invention of type of circuit as it might be used in a GSM band power amplifier circuit; although it is understood the present invention is not limited in this respect. These simulations demonstrate several critical aspects of the invention. First, the circuit with variable matching impedance 215 may produce maximum output power with equivalent efficiency (shown as Y-Axis 205) as the fixed matching circuit 220. Second, at lower output power levels (power levels shown as X-Axis 210) the variable network can produce far superior results. In this case efficiencies are shown to be up to 15 percentage points higher than those achieved by the fixed impedance matching network. These efficiency improvements allow lower dissipated heat in the device and lower power consumption. Reduced amplifier power consumption is an extremely important consideration in many applications including, for example but not limited to, mobile communication terminals which rely on battery supplies.

Figure 3:
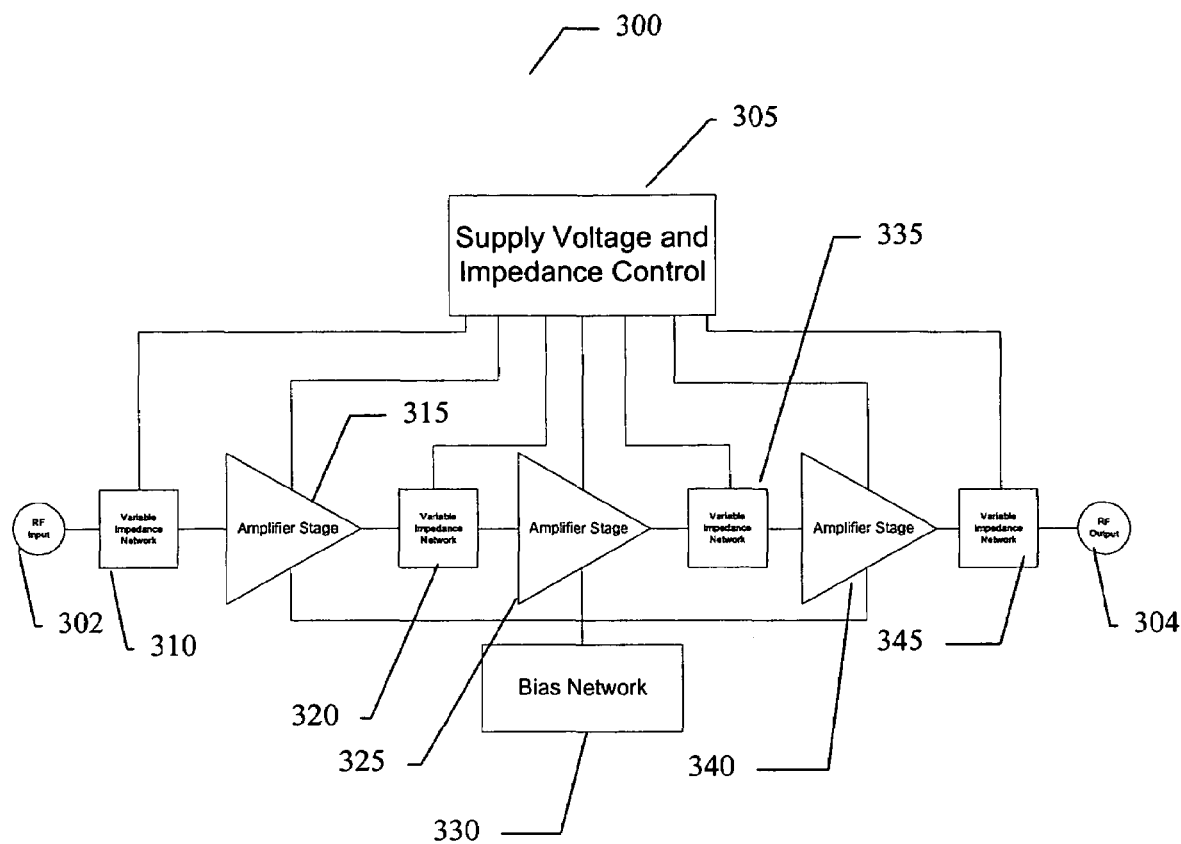
FIG. 3 illustrates one embodiment of the present invention wherein the supply voltage and impedance control are applied to one or more stages of an amplifier.

Turning now to FIG. 3, illustrated generally at 300, is depicted how the supply voltage and impedance control may be applied to one or more stages of an amplifier. This impedance and supply voltage control may be applied to one or more amplification stages within the transmission system thereby enabling a single power amplifier to operate in both saturated and linear modes including but not limited to GSM, EDGE, WCDMA, and CDMA. In addition, this control methodology may be applied to both open and closed loop power control topologies.

This improvement may be possible through optimization of the load line for each specific point of operation. The optimum load line will vary with the format of data transmission or modulation scheme, frequency of operation, output power level, input power level, bias levels, and specifics of the amplifier such as transistor size. While output power level may be varied by bias changes and/or input power changes, the efficiency, linearity, and gain may be affected and improved by the supply voltages and impedance controls or a simultaneous combination thereof.

Looking again at FIG. 3 is an embodiment of the present invention accomplishing the aforementioned, although it is understood that this is merely an example and the present invention is not limited to the embodiment of FIG. 3. An RF input 302 and supply voltage and impedance control 305 may be connected to variable impedance network 310 and the output of the first variable impedance network 310 may be input to first amplifier stage 315, the output of which may be input to the second variable impedance network 320, the output of which may be input to second amplifier stage 325, the output of which may be input to third variable impedance network 335, the output of which may be input to third amplifier stage 340 and finally the output of which may be input to fourth variable impedance network 345 which may either provide an input for additional amplifier stages or to an RF output 304. All of which may be associated with supply voltage and impedance control 305 and bias network 330. Again, it is understood that the number of variable impedance matching networks and amplifier stages and the particular interconnection thereof are merely one illustrative example and it is understood that one of ordinary skill in the art may vary the number and associations of variable impedance networks, amplifier stages, supply voltage and impedance controls and bias networks and stay within the scope of the present invention.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An amplifier system, comprising:
   at least one variable impedance matching network, the output of which provides the input to at least one amplifier stage or provides an output of the power amplifier itself, wherein said at least one variable impedance network includes at least one voltage tunable dielectric capacitor with said tunable dielectric including at least one metal silicate phase; and
   a bias network associated with said at least one amplifier stage.

2. The amplifier system of claim 1, wherein said metal silicates include metals from Group 2A of the Periodic Table.

3. The amplifier system of claim 2, wherein said metal silicates are selected from the group consisting of: Mg2SiO4, CaSiO3, BaSiO3 and SrSiO3.

4. The amplifier system of claim 1, wherein said at least one variable impedance network and said at least one amplifier stage is a plurality of impedance networks connected to a plurality of amplifier stages.

5. The amplifier system of claim 1, wherein said tunable dielectric includes at least two additional metal oxide phases.

6. The amplifier system of claim 5, wherein said tunable dielectric includes additional metal oxides that include metals from Group 2A of the Periodic Table.

7. The amplifier system of claim 6, wherein said voltage tunable dielectriccapacitor includes Parascan® voltage tunable dielectric material.

8. The amplifier system of claim 3, wherein said impedance and supply voltage control applied to said at least one amplifier stages within a transmission system enable a single power amplifier to operate in multiple including both saturated and linear modes as applied in GSM, EDGE, WCDMA, and CDMA.

9. The amplifier system of claim 3, wherein said impedance control may include both open and closed loop power control topologies.

10. The amplifier system of claim 1, wherein said at least one variable impedance matching network is a lumped element inductor/capacitor impedance matching network.

11. A method of varying the impedance in an amplifier system, comprising:
    varying the impedance in at least one variable impedance matching network to provide a variable input or output impedance to at least one amplifier stage by applying a control voltage to at least one variable capacitor within said at least one variable impedance network in order to vary the impedance of said at least one amplifier stage, wherein said at least one voltage tunable dielectric capacitor includes tunable dielectric including at least one metal silicate phase.

12. The method of varying the impedance in an amplifier system of claim 11, wherein said at least one metal silicate include metals from Group 2A of the Periodic Table.

13. The method of varying the impedance in an amplifier system of claim 12, wherein said at least one metal silicate is selected from the group consisting of: Mg2SiO4, CaSiO3, BaSiO3 and SrSiO3.

14. The method of varying the impedance in an amplifier system of claim 11, wherein said at least one variable impedance network and said at least one amplifier stage is a plurality of impedance networks connected to a plurality of amplifier stages.

15. The method of varying the impedance in an amplifier system of claim 11, wherein said tunable dielectric includes at least two additional metal oxide phases.

16. The method of varying the impedance in an amplifier system of claim 15, wherein said metal oxides include metals from Group 2A of the Periodic.

17. The method of varying the impedance in an amplifier system of claim 16, wherein said voltage tunable dielectric capacitor includes Parascan® voltage tunable dielectric material.

18. The method of varying the impedance in an amplifier system of claim 13, wherein said impedance and supply voltage control applied to said at least one amplifier stages within a transmission system thereby enable a single power amplifier to operate in multiple including both saturated and linear modes as applied in GSM, EDGE, WCDMA, and CDMA.

19. The method of varying the impedance in an amplifier system of claim 13, wherein said impedance control may include both open and closed loop power control topologies.

20. The method of varying the impedance in an amplifier system of claim 11, wherein said at least one variable impedance matching network is a lumped element inductor/capacitor impedance matching network.

21. A system capable of impedance matching, comprising:
   an apparatus connected an amplifier via an impedance matching network; and
   said impedance matching network includes at least one voltage tunable dielectric capacitor enabling the ability to vary the impedance of said impedance matching network, wherein said at least one voltage tunable dielectric capacitor includes a tunable dielectric material which includes at least one metal silicate phase.

22. The system of claim 21, wherein said metal silicates include metals from Group 2A of the Periodic Table.

23. The system of claim 22, wherein said voltage tunable dielectric capacitor includes Parascan® voltage tunable dielectric material.

24. The system of claim 21, wherein said impedance matching network may be applied to both open and closed loop power control topologies.

25. The system of claim 1, wherein said apparatus is selected from the group consisting of: antenna, filter, subsequent amplifier stage, diplexer, switch, mixer, oscillator, up converter, or multiplier.

* * * * *